United States Patent
Matono et al.

(10) Patent No.: US 9,105,957 B2
(45) Date of Patent: Aug. 11, 2015

(54) ATTENUATOR

(75) Inventors: Naoto Matono, Hong Kong (CN); Tsz Chun Ng, Hong Kong (CN); Hui Wang, Hong Kong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 559 days.

(21) Appl. No.: 13/435,594

(22) Filed: Mar. 30, 2012

(65) Prior Publication Data

US 2013/0169386 A1 Jul. 4, 2013

(30) Foreign Application Priority Data

Dec. 28, 2011 (CN) .......................... 2011 1 0446010

(51) Int. Cl.
*H01P 1/22* (2006.01)
*H03H 7/24* (2006.01)
*H01L 27/08* (2006.01)

(52) U.S. Cl.
CPC ...... *H01P 1/227* (2013.01); *H01P 1/22* (2013.01); *H01L 27/0802* (2013.01); *H03H 7/24* (2013.01)

(58) Field of Classification Search
CPC .......................................................... H01P 1/22

USPC ................................................ 333/81 A, 81 R
See application file for complete search history.

(56) References Cited

U.S. PATENT DOCUMENTS

2010/0308940 A1 * 12/2010 Shirasaki .................... 333/22 R

FOREIGN PATENT DOCUMENTS

| JP | 5-258924 | 10/1993 |
|----|----------|---------|
| JP | 5-343212 | 12/1993 |
| JP | 6-104591 | 4/1994 |
| JP | 8-148380 | 6/1996 |
| JP | 11-55008 | 2/1999 |
| JP | 2004-342705 | 12/2004 |
| JP | 2012-5050 | 1/2012 |

* cited by examiner

*Primary Examiner* — Stephen E Jones
(74) *Attorney, Agent, or Firm* — Nixon & Vanderhye PC (57) ABSTRACT

An attenuator includes: a first portion including a first insulating substrate and a resistor section formed on the first insulating substrate; and a second portion including a second insulating substrate and a terminal section, the second insulating substrate being separated from the first insulating substrate, and the terminal section being formed on the second insulating substrate to be connected to the resistor section.

7 Claims, 6 Drawing Sheets

ATTENUATOR

This application claims priority to Chinese Application No. 201110446010.4 filed 28 Dec. 2011, the entire contents of which is hereby incorporated by reference.

BACKGROUND

This invention relates to an attenuator that is used in, for example, a terminal end section of a high frequency transmission circuit, and is to attenuate an input signal.

In related art, an attenuator having a resistor has been used for suppressing unnecessary reflection of a signal or attenuating an input signal to be outputted, for example, at an end of a signal line of a high frequency circuit (for example, see Japanese Unexamined Patent Application Publication No. Hei6-104591). Such an attenuator is desired to have the following properties: downsized and simplified configuration; easiness of connection to a signal line; excellent heat dissipation ability at the time of being supplied with power and less deterioration in the ability due to heat (excellent power durability); constant characteristic impedance in a predetermined frequency band; and less and stable reflectance loss in a predetermined frequency band (excellent high frequency property).

For example, in Japanese Unexamined Patent Application Publication No. Hei11-55008, there is disclosed a power resistor for high frequency capable of obtaining necessary power durability without increasing an area of a resistor in proportion to a rated power value.

SUMMARY

Such an attenuator generally has a configuration in which a circuit pattern including a plurality of resistors, connection terminals, a ground electrode, and the like is provided on an insulating substrate. Here, in consideration of heat generation of the resistors, the insulating substrate is formed of a highly thermal-conductive material excellent in heat dissipation, such as aluminum nitride (AlN), aluminum oxide (AlOx), beryllium oxide (BeO), or AlTiC ($Al_2O_3$.TiC).

However, when the insulating substrate is formed of such a highly thermal-conductive material, heat generated in the resistors is efficiently transferred to the connection terminals provided on the insulating substrate, depending on the usage environment of the attenuator. Accordingly, in the case where the attenuator is downsized, or in the case where the attenuator is used in the high frequency circuit that is supplied with a high power of 10 W or more for example, it is conceivable that the connection terminals are heated, for example, a solder bonding the connection terminals to external connection wirings is melted or softened, and thus the connection wirings are disbonded from the connection terminals. In addition, the insulating substrate formed of such a highly thermal-conductive material is expensive compared with an insulating substrate formed of silicon (Si) or glass, thereby increasing component cost.

It is desirable to provide a downsized attenuator with increased heat dissipation.

An attenuator according to an embodiment of the invention includes the following (1) and (2):

(1) a first portion including a first insulating substrate and a resistor section formed on the first insulating substrate; and (2) a second portion including a second insulating substrate and a terminal section, the second insulating substrate being separated from the first insulating substrate, and the terminal section being formed on the second insulating substrate to be connected to the resistor section.

In the attenuator according to the embodiment of the invention, the terminal section is provided on the second insulating substrate different from (separated from) the first insulating substrate with the resistor section. Accordingly, compared with the case where the terminal section is provided on the substrate together with the resistors, the heat generated in the resistor section in use is less likely to be transferred to the terminal section.

In the attenuator according to the embodiment of the invention, the first insulating substrate is preferably formed of a material different from that of the second insulating substrate, and in particular, the second insulating substrate preferably has a thermal conductivity lower than that of the first insulating substrate. In such a case, the heat generated in the resistors is less likely to be transferred to the terminal section all the more.

In the attenuator according to the embodiment of the invention, the first insulating substrate is formed of, for example, one or more of aluminum nitride (AlN), aluminum oxide (AlOx), beryllium oxide (BeO), and $Al_2O_3$.TiC. The second insulating substrate is formed of, for example, one or more of silicon (Si), silicon oxide (SiOx), and glass.

In the attenuator according to the embodiment of the invention, the terminal section may include a first terminal and a second terminal, and the resistor section may include a first resistor, a second resistor and a third transistor. The first resistor is connected between the first and second terminals. One end of the second resistor is connected to the first terminal, one end of the third resistor is connected to the second terminal, and the other end of each of the second and third transistors is grounded. In such a case, the first and second terminals as well as the first to third resistors each include a common metal pattern that is integrated by collective formation.

In the attenuator according to the embodiment of the invention, since the terminal section is provided on the second insulating substrate that is separated from the first insulating substrate provided with the resistors, the heat generated in the resistors in use is suppressed from transferring to the terminal section. Therefore, even if the attenuator is downsized, the solder at the terminal section is allowed to be prevented from melting. On the other hand, the first insulating substrate is formed of a highly thermal-conductive material to increase heat dissipation so that characteristic deterioration due to the heat is avoidable. Accordingly, while the attenuator is downsized as a whole, the characteristics deterioration or malfunction due to the heat generation is avoidable. In addition, since the resistor section and the terminal section are provided in different substrates, in particular when the attenuator includes a plurality of resistors, the resistors are collected on the first insulating substrate and thus the whole configuration of the attenuator is allowed to be downsized.

Moreover, arrangement of the first and second insulating substrates apart from each other is effective to surely insulate the heat conduction from the resistor section to the terminal section.

DETAILED DESCRIPTION

Hereinafter, a preferred embodiment of the invention will be described in detail with reference to drawings.

[Configuration of Attenuator 1]

Figure 1:
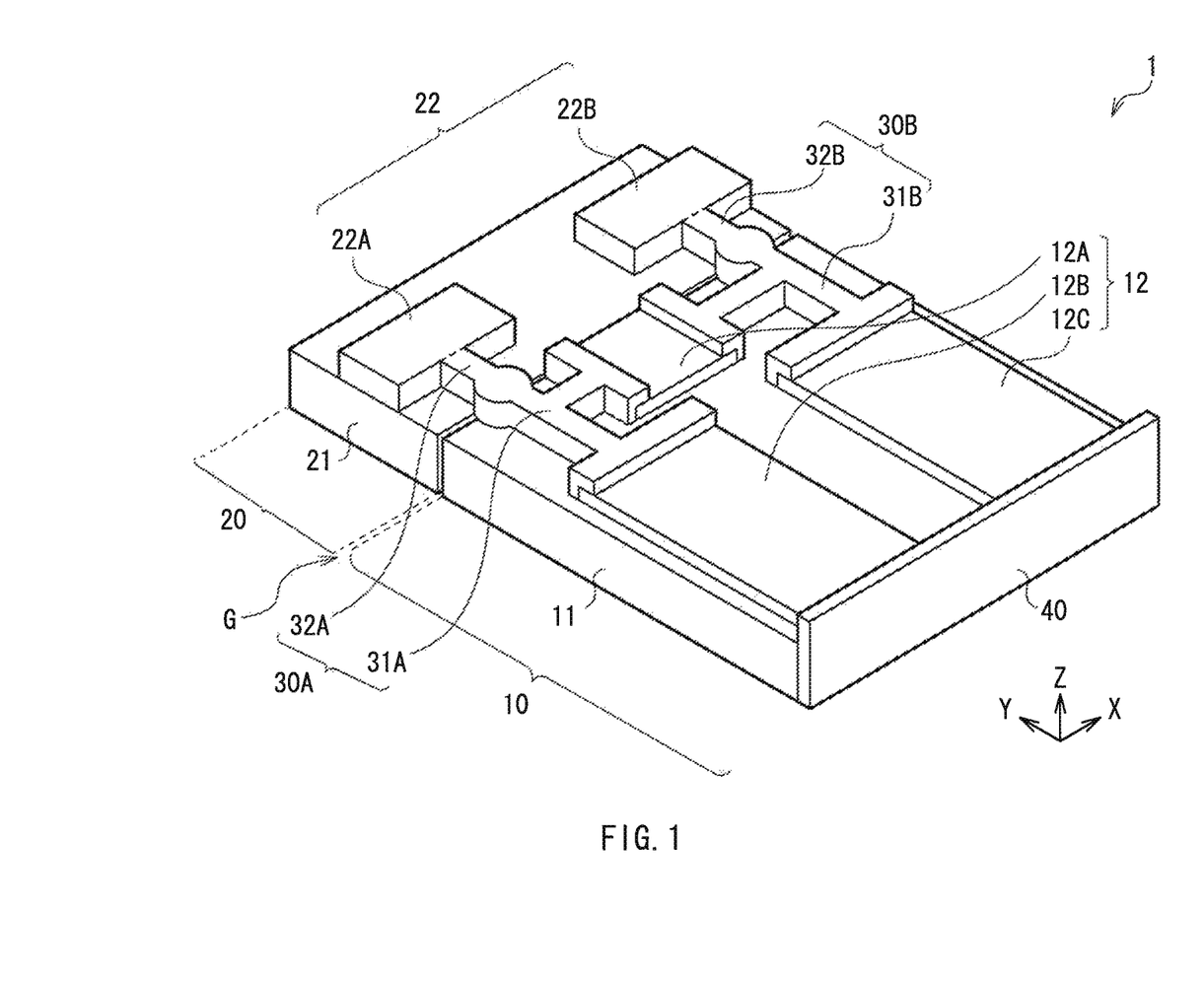
FIG. 1 is a perspective view illustrating a general configuration of an attenuator according to an embodiment of the invention.
Figure 2:
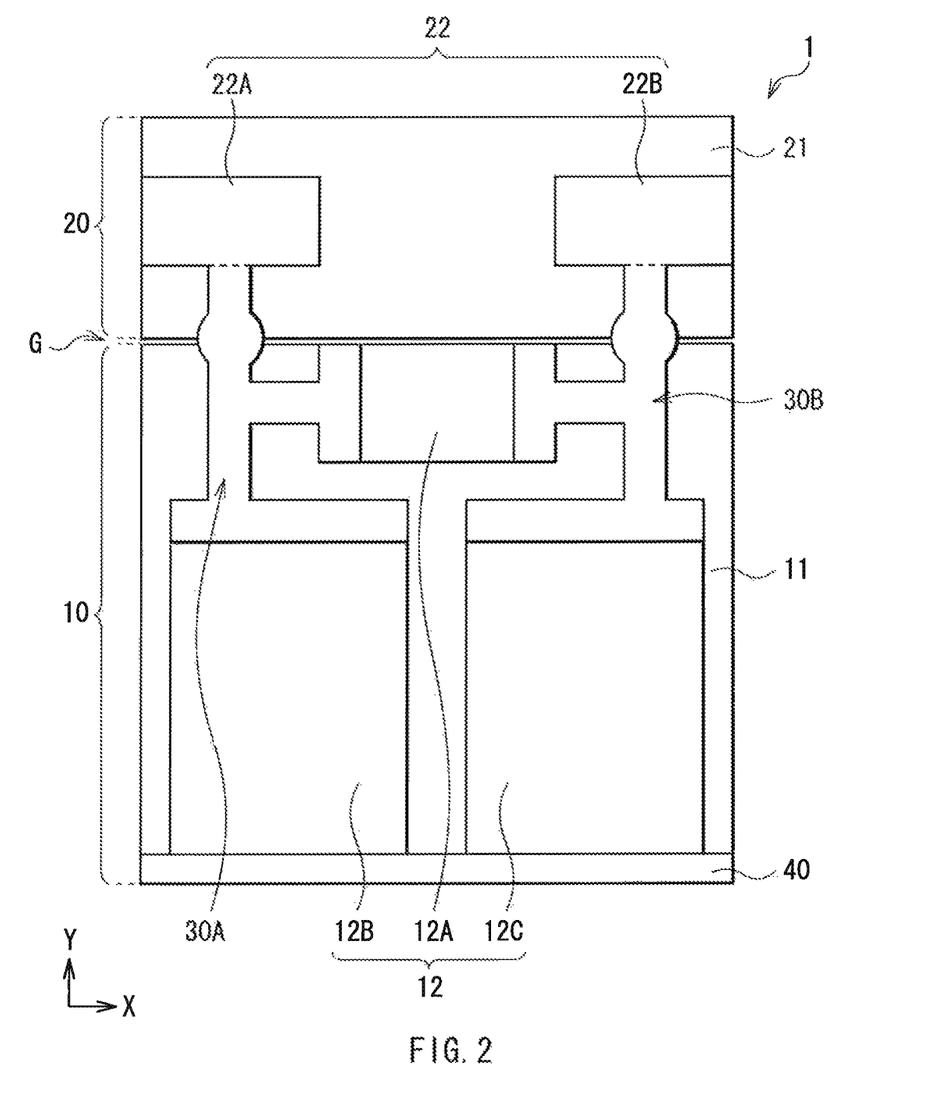
FIG. 2 is a plan view of the attenuator illustrated in FIG. 1.

FIG. 1 is a perspective view illustrating a general configuration of an attenuator 1 according to an embodiment of the invention, and FIG. 2 is a plan view of the attenuator 1 illustrated in FIG. 1. Moreover, FIG. 3 illustrates a circuit configuration of the attenuator 1.

The attenuator 1 is an electronic device attenuating an input signal that is included in a predetermined frequency band to an appropriate signal level. The attenuator 1 is connected to an antenna transmitting and receiving a signal in a relay station that performs high frequency radio communication, for example, and is used for attenuating a signal reflected by the antenna to an appropriate signal level.

Figure 3:
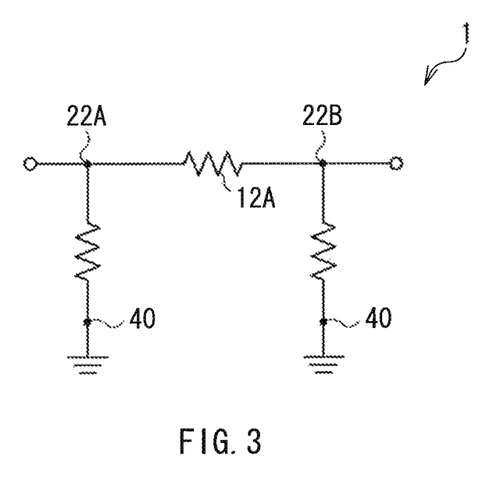
FIG. 3 is a circuit diagram of the attenuator illustrated in FIG. 1.

As illustrated in FIG. 1 to FIG. 3, the attenuator includes a first portion 10 and a second portion 20. The first portion 10 includes, for example, a plate-like insulating substrate 11 extending in an XY plane, and a resistor section 12 formed on the surface of the insulating substrate 11. On the other hand, the second portion 20 includes, for example, a plate-like insulating substrate 21 extending in the XY plane similarly to the insulating substrate 11, and a terminal section 22 formed on the surface thereof and connected to the resistor section 12.

The insulating substrate 11 is formed of, for example, an insulating material including one or more of aluminum nitride (AlN), aluminum oxide (AlOx), beryllium oxide (BeO), and $Al_2O_3$.TiC. The constituent material of the insulating substrate 11 is desirably high in thermal conductivity and excellent in workability, like the materials described above.

The resistor section 12 includes resistors 12A to 12C. The resistor 12A is sandwiched between an input electrode 22A and an output electrode 22B (both described later) in the circuit. One end of the resistor 12B is connected to the input electrode 22A, and the other end is connected to a ground electrode 40. One end of the resistor 12C is connected to the output electrode 22B, and the other end is connected to the ground electrode 40.

The insulating substrate 21 is formed of a material having a thermal conductivity lower than that of the insulating substrate 11. Examples of such a material include, for example, Si (silicon), SiOx (silicon oxide), and glass.

The terminal section 22 has the input electrode 22A as a first terminal and the output electrode 22B as a second terminal. The input electrode 22A and the output electrode 22B are connected to each other by the resistor 12A through connection sections 30A and 30B. The connection section 30A is a conductive film including a connection pattern 31A and a connection pattern 32A. The connection pattern 31A is provided on the insulating substrate 11 and connects one end of the resistor 12A to one end of the resistor 12B, and the connection pattern 32A is provided on the insulating substrate 21. Likewise, the connection section 30B is a conductive film including a connection pattern 31B and a connection pattern 32B. The connection pattern 31B is provided on the insulating substrate 11 and connects one end of the resistor 12A to one end of the resistor 12C, and the connection pattern 32B is provided on the insulating substrate 21.

Each of the input electrode 22A, the output electrode 22B, and the ground electrode 40 is a conductor formed of a highly conductive material such as Cu (copper), Al (aluminum), Au (gold), Ag (silver), Ta (tantalum), Ru (ruthenium), Rh (rhodium). The constituent materials of the input electrode 22A, the output electrode 22B, and the ground electrode 40, although may be different from each other, are preferably the same because the manufacturing process is allowed to be simplified.

Moreover, the input electrode 22A, the output electrode 22B, and the ground electrode 40 are desirably covered with a plating film formed of one or both of Ni (nickel) and Sn (tin). This is because, when a lead wire to the outside is connected to the input electrode 22A and the like by solder bonding, the plating film functions as a barrier layer for preventing the solder from spreading, and favorable solder wettability is allowed to be ensured. In addition, the ground electrode 40 is provided common to the resistors 12B and 12C, and is grounded through a non-illustrated wiring.

As the constituent material of the resistors 12A to 12C, TaN (tantalum nitride), NiCr (nickel-chromium alloy)-based alloy, and the like are suitable. Even in the case where the resistors 12A to 12C have a small plane area, since, by using these materials, the amount of the heat generated in the resistors 12A to 12C is high and thus the input signal is efficiently attenuated, it is advantageous to downsize the whole configuration of the attenuator 1.

The resistor 12A has a function as an attenuating resistor attenuating an input signal from the input electrode 22A to a predetermined amplitude. In other words, the resistor 12A is an important factor determining the attenuation degree of the signal when the input signal from the input electrode 22A is output from the output electrode 22B. The resistors 12B and 12C determine a circuit constant in the attenuator 1.

In this case, the insulating substrates 11 and 21 are bonded to each other through an adhesive agent (not illustrated) to allow one end surface of the insulating substrate 11 to face one end surface of the insulating substrate 21 as illustrated in FIG. 1, for example. In other words, a gap G corresponding to the thickness of the adhesive agent exists between the insulating substrates 11 and 21. At this time, in the height direction (Z-axis direction), positions of a top surface and a bottom surface of the insulating substrate 11 preferably correspond to positions of a top surface and a bottom surface of the insulating substrate 21, respectively.

Moreover, in the attenuator 1, an insulating protective film (not illustrated) is provided to cover portions other than the input electrode 22A, the output electrode 22B, and the ground electrode 40, that is, the resistors 12A to 12C and the exposed top surfaces of the insulating substrates 11 and 21. As the constituent material of the protective film, an epoxy-based resin, a polyimide resin, or glass is preferable. Alternatively, the protective film may be formed of aluminum oxide. Note that in FIG. 1, the protective film may be provided to cover a part of each of the input electrode 22A, the output electrode 22B, and the ground electrode 40 as well.

[Method of Manufacturing Attenuator 1]

Subsequently, a method of manufacturing the attenuator 1 will be described.

First, the insulating substrate 11 is prepared, and a wiring pattern (not illustrated) is formed with use of copper or the like on the surface of the insulating substrate 11. Then, a resistance film that becomes the resistors 12A to 12C later is formed with use of the above-described predetermined material. The wiring pattern and the resistance film may be formed by gas phase methods such as sputtering. Subsequently, patterning of the resistance film is performed by, for example, photolithography to form the resistors 12A to 12C with respective predetermined shapes on respective predetermined positions. After that, the connection patterns 31A and 31B are formed with use of a predetermined material by plating or gas phase methods such as sputtering on respective predetermined positions. Consequently, the first portion 10 is tentatively completed.

The insulating substrate 21 is prepared, and a metal film that becomes the input electrode 22A, the output electrode 22B, and the connection patterns 32A and 32B later is formed with use of the above-described predetermined material over the entire surface of the insulating substrate 21. The metal film may also be formed by gas phase methods such as sputtering, and the like. After that, patterning of the metal film is performed by, for example, photolithography to form the input electrode 22A, the output electrode 22B, and the connection patterns 32A and 32B with respective predetermined shapes on the respective predetermined positions. Consequently, the second portion 20 is tentatively completed.

Subsequently, a predetermined end surface of the insulating substrate 11 is allowed to face a predetermined end surface of the insulating substrate 21, and then these end surfaces are bonded to each other with an adhesive agent to bond the insulating substrates 11 and 21 to each other. Consequently, the gap G corresponding to the thickness of the adhesive agent is formed between the insulating substrates 11 and 21. Note that the adhesive agent may totally or partially cover the end surfaces of the insulating substrates 11 and 21 facing to each other. After that, the connection patterns 31A and 31B provided on the insulating substrate 11 are bonded to the connection patterns 32A and 32B provided on the insulating substrate 21, respectively, with a solder and the like. Finally, the attenuator 1 is completed by forming the ground electrode 40, and the like. The ground electrode 40 is provided to contact with an end portion of the resistors 12B and 12C opposite from the end portion provided with the connection sections 30A and 30B. At this time, for example, after a ground layer (not illustrated) is formed by sputtering or the like, a plating layer is formed to cover the ground layer.

[Effect of Attenuator 1]

As described above, in the embodiment, while the resistor section 12 generating heat is provided on the insulating substrate 11 that is formed of MN or the like and is excellent in heat dissipation, the terminal section 22 is provided on the insulating substrate 21 separated from the insulating substrate 11. With this configuration, compared with the case where the terminal section 22 is provided on the insulating substrate 11, heat transfer from the resistor section 12 to the terminal section 22 is allowed to be suppressed in use. Accordingly, even in the case of the downsized attenuator 1, debonding of the connection wiring from the terminal section 22 caused by the fact that the solder which bonds the terminal section 22 and the connection wiring from the outside is melted or softened is allowed to be prevented. In particular, it is effective that the insulating substrate 21 is formed of a material having a lower thermal conductivity. In addition, the insulating substrate 11 is formed of a highly thermal-conductive material to increase heat dissipation, and therefore the attenuation property which is supposed to be exerted is avoidable from deteriorating due to heat. Therefore, while the whole configuration of the attenuator 1 is downsized, the characteristic deterioration or malfunction due to the heat generation is avoidable. Moreover, since the resistor section 12 and the terminal section 22 are provided on the different substrates (the insulating substrates 11 and 21), in particular when the attenuator 1 includes a plurality of resistors, the plurality of resistors are collected on the insulating substrate 11 to downsize the whole configuration of the attenuator 1. Note that, in the embodiment, the case where only the terminal section 22 is provided on the insulating substrate 21 has been described, however, other function sections such as a capacitor and an inductor may be provided on the insulating substrate 21 because characteristic deterioration due to the heat in the function sections is avoidable.

(Modification 1)

Figure 4:
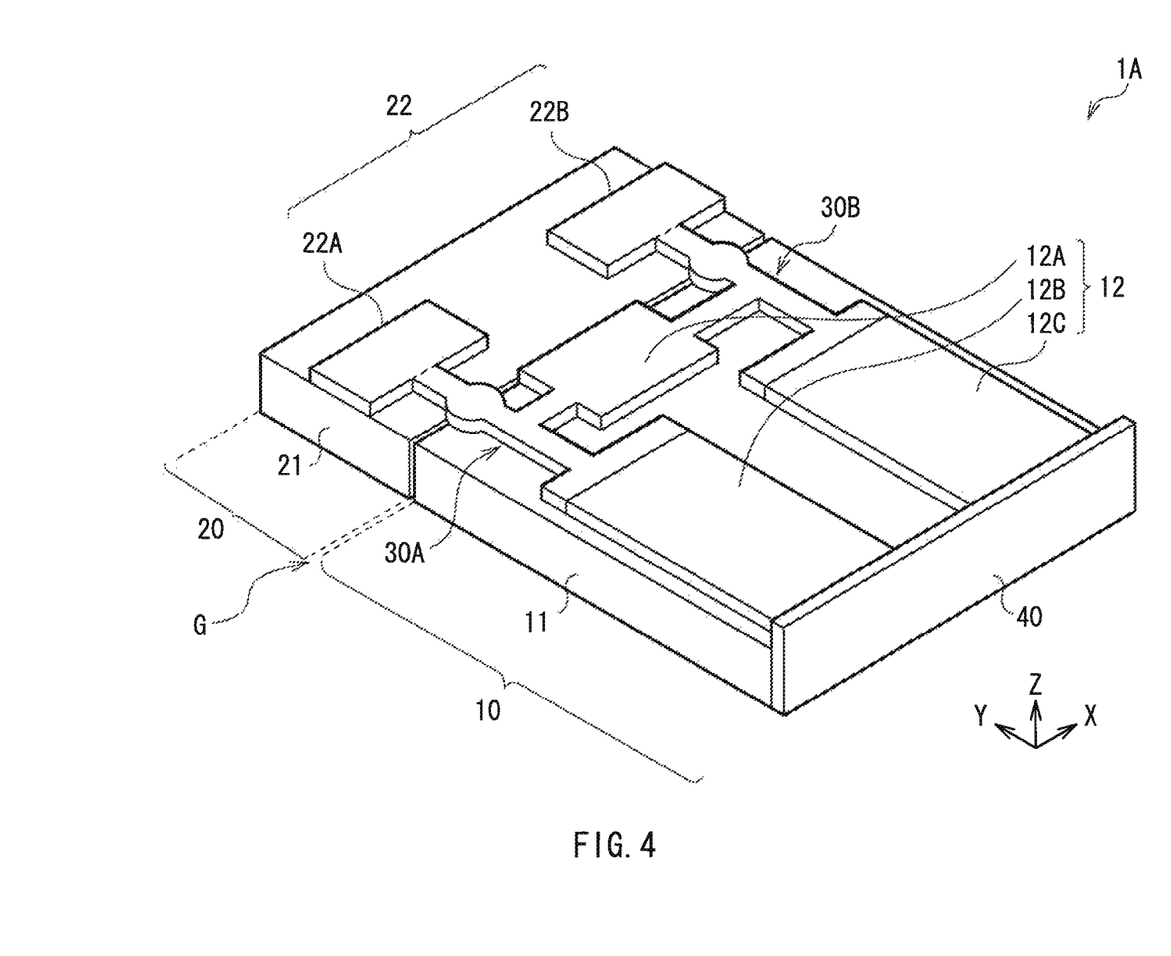
FIG. 4 is a perspective view illustrating a general configuration of an attenuator according to a first modification.

Next, an attenuator 1A as a first modification of the embodiment will be described with referring to FIG. 4. As illustrated in FIG. 4, in the modification, positions of a top surface and a bottom surface of the insulating substrate 11 mutually correspond to positions of a top surface and a bottom surface of the insulating substrate 21, respectively, in the height direction (Z-axis direction). In addition, the height positions of the top surfaces of the resistors 12A to 12C and the height positions of the top surfaces of the input electrode 22A and the output electrode 22B all correspond to one another. The top surface herein is a surface opposite to a surface facing the insulating substrate 11 or 12. In other words, the top surfaces of the resistors 12A to 12C as well as the top surfaces of the input electrode 22A and the output electrode 22B are included in a common XY plane. In this modification, with such a configuration, it is possible to achieve the attenuator 1A thinner compared with the attenuator 1 of the above-described embodiment.

(Modification 2)

Figure 5:
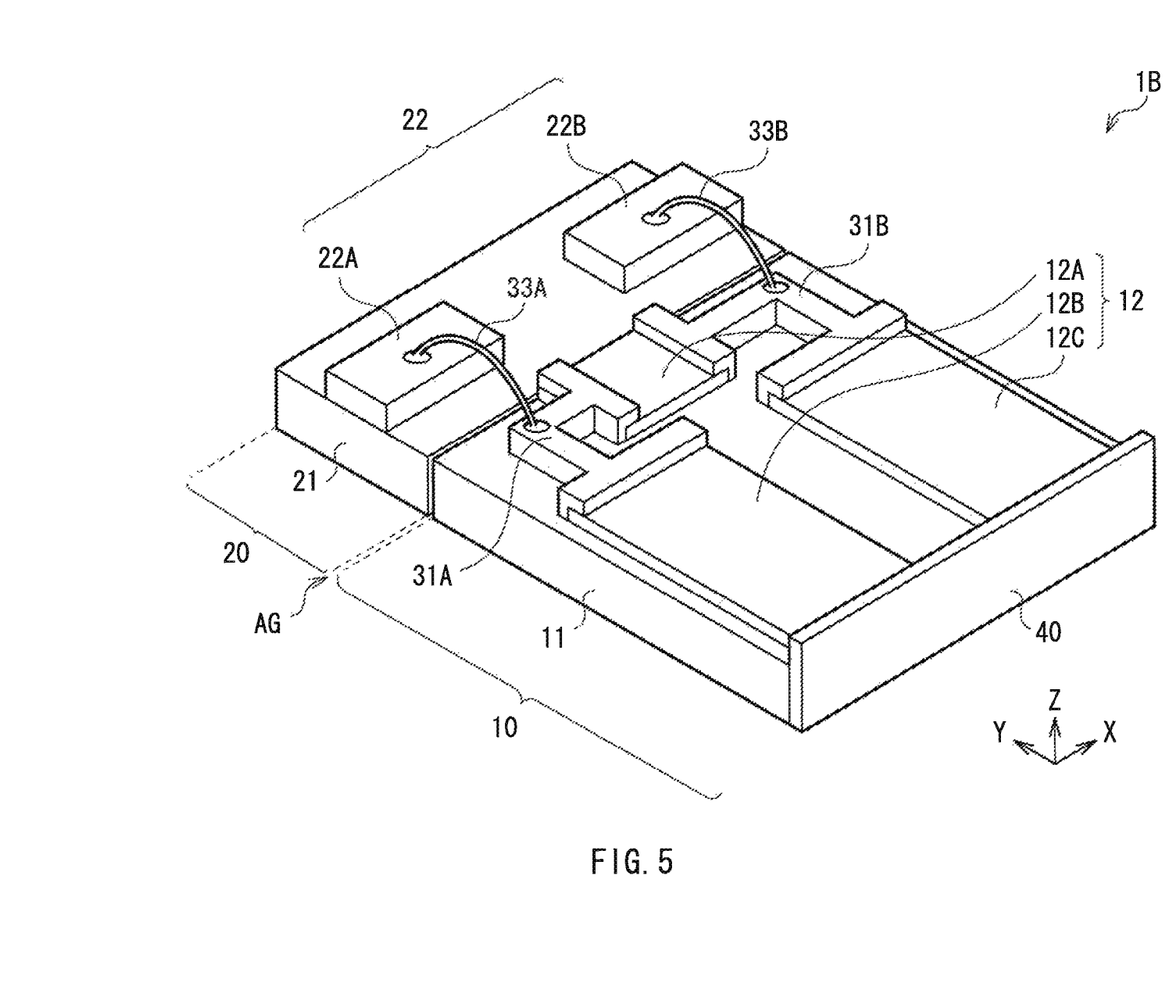
FIG. 5 is a perspective view illustrating a general configuration of an attenuator according to a second modification.

Subsequently, an attenuator 1B as a second modification of the embodiment will be described with referring to FIG. 5. The attenuator 1 of the above-described embodiment is configured by bonding the insulating substrates 11 and 21 to each other with the adhesive agent therebetween. In contrast, the attenuator 1B illustrated in FIG. 5 is configured by disposing the insulating substrates 11 and 21 to face each other with an air gap AG of a slight width so that one end surface of the insulating substrate 11 faces one end surface of the insulating substrate 21. Note that the size of the air gap AG (a distance between the insulating substrates 11 and 21) is allowed to be set arbitrarily. Moreover, the width of the air gap AG is maintained to be constant by, for example, attaching the insulating substrates 11 and 21 to respective other fixed members. In the modification, the connection sections 31A and 31B which electrically connect the resistor 12A to the resistors 12B and 12C, respectively, are electrically connected to the input electrode 22A and the output electrode 22B with the wires 33A and 33B, respectively. The wires 33A and 33B are provided over the air gap AG. In the modification, with such a configuration, the heat conduction from the resistor section 12 to the terminal section 22 is surely insulated, and affect of the heat to the terminal section 22 is effectively reduced.

(Modification 3)

Figure 6:
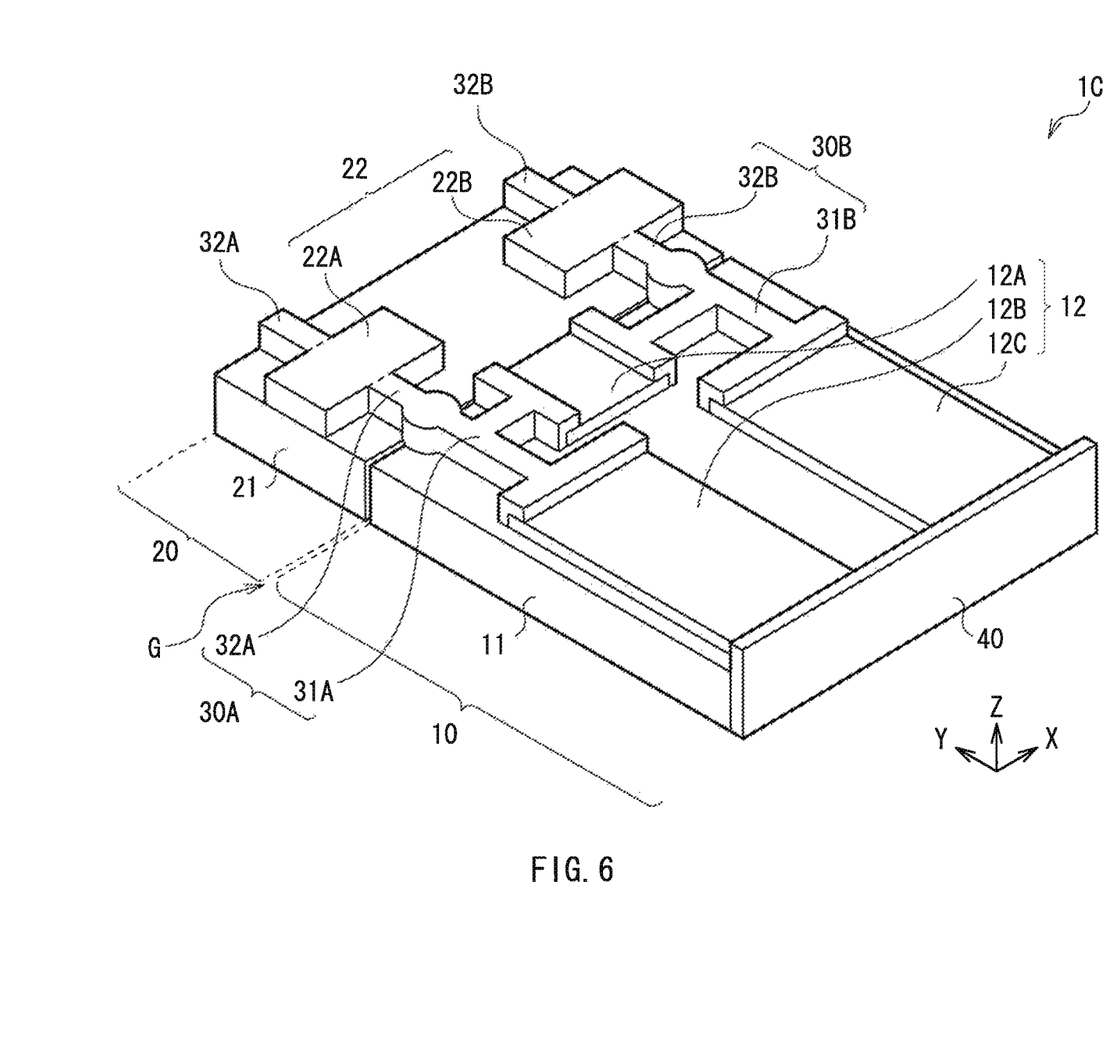
FIG. 6 is a perspective view illustrating a general configuration of an attenuator according to a third modification.

Next, an attenuator 1C as a third modification of the embodiment will be described with referring to FIG. 6. In the second portion 20 of the above-described attenuator 1, the connection pattern 32A is provided on one side of the input electrode 22A and the connection pattern 32B is provided on one side of the output electrode 22B. In contrast, in this modification (the attenuator 1C), the connection patterns 32A are provided on both sides of the input electrode 22A, and the connection patterns 32B are provided on both sides of the output electrode 22B. With this configuration, bonding of the insulating substrates 11 and 21 is performed easily at the time of manufacturing the attenuator 1C. This is because the connection patterns 31A and 31B of the first portion 10 are allowed to be connected to any of the two connection patterns 32A and the two connection patterns 32B in the second portion 20.

Hereinbefore, although the invention has been described with referring to the embodiment and the modifications, the invention is not limited thereto, and various modifications may be made. For example, in the attenuator 1 of FIG. 1, the end surfaces of the insulating substrates 11 and 21 which are bonded to each other are flat surfaces, however this is not limited thereto. For example, it is possible to adopt a configuration in which a protrusion provided on an end surface of one of the insulating substrates 11 and 21 is fitted in a recess that is provided on a position corresponding to the protrusion, on an end of the other of the insulating substrates 11 and 21 and has a size corresponding to the protrusion.

Moreover, in the above-described embodiment and the like, the top surface and the bottom surface of the insulating substrate 11 mutually correspond to the top surface and the bottom surface of the insulating substrate 21, respectively. However, these surfaces may not correspond to each other (may be shifted in the height direction.)

Furthermore, the planer shape, the dimension (the thickness and the size), and the dimensional ratio of the resistor section 12, the terminal section 22, and the connection sections 30A and 30B are not limited to those illustrated in the figures, and are allowed to be set arbitrarily. The arrangement position of each component is also modified appropriately.

1 . . . attenuator, 10 . . . first portion, 20 . . . second portion, 11, 21 . . . insulating substrate, 12 . . . resistor section, 22 . . . terminal section, 22A . . . input electrode, 22B . . . output electrode, 30A, 30B . . . connection section, 40 . . . ground electrode

What is claimed is:

1. An attenuator comprising:
a first portion including a first insulating substrate and a resistor section formed on the first insulating substrate; and
a second portion including a second insulating substrate and a terminal section, the second insulating substrate being separated from the first insulating substrate, and the terminal section being formed on the second insulating substrate to be connected to the resistor section,
wherein the terminal section includes a first terminal and a second terminal, and
wherein the resistor section includes a first resistor, a second resistor and a third resistor, the first resistor being connected between the first and second terminals, one end of the second resistor being connected to the first terminal, one end of the third resistor being connected to the second terminal, the other end of each of the second and third resistors being grounded.

2. The attenuator according to claim 1, wherein the first insulating substrate is formed of a material different from that of the second insulating substrate.

3. The attenuator according to claim 1, wherein the first insulating substrate has a thermal conductivity higher than that of the second insulating substrate.

4. The attenuator according to claim 1, wherein the first insulating substrate is formed of one or more of AlN (aluminum nitride), AlOx (aluminum oxide), BeO (beryllium oxide), and $Al_2O_3.TiC$.

5. The attenuator according to claim 1, wherein the second insulating substrate is formed of one or more of Si (silicon), SiOx (silicon oxide), and glass.

6. The attenuator according to claim 1, wherein
a top surface of the first insulating substrate and a top surface of the second insulating substrate are coplanar, and
top surfaces of the first to third resistors and the first and second terminals are of the same position in height, the first to third resistors being provided on the top surface of the first insulating substrate, the first and second terminals being provided on the top surface of the second insulating substrate.

7. The attenuator according to claim 1, wherein bottom surfaces of the first and second insulating substrates are of the same position in height.

* * * * *